US006753116B2

(12) United States Patent
Cauchi

(10) Patent No.: US 6,753,116 B2
(45) Date of Patent: Jun. 22, 2004

(54) MULTIPLE PHOTOLITHOGRAPHIC EXPOSURES WITH DIFFERENT NON-CLEAR PATTERNS

(75) Inventor: John Cauchi, Sunnyvale, CA (US)

(73) Assignee: Mosel Vitelic, Inc., Hsin-Chu (TW)

( * ) Notice: Subject to any disclaimer, the term of this patent is extended or adjusted under 35 U.S.C. 154(b) by 212 days.

(21) Appl. No.: 10/058,174

(22) Filed: Jan. 25, 2002

(65) Prior Publication Data

US 2003/0143468 A1 Jul. 31, 2003

(51) Int. Cl.[7] ............................. G03F 9/00; G03C 5/00
(52) U.S. Cl. ......................................... 430/5; 430/394
(58) Field of Search ............................ 430/5, 22, 30, 430/394; 716/19, 21

(56) References Cited

U.S. PATENT DOCUMENTS

| 5,631,112 A | 5/1997 | Tsai et al. ..................... 430/22 |
| 5,663,893 A | 9/1997 | Wampler et al. ............ 364/491 |
| 5,863,712 A | 1/1999 | Von Bunau et al. ........ 430/396 |
| 6,280,887 B1 | 8/2001 | Lu ................................. 430/5 |
| 6,301,008 B1 | 10/2001 | Ziger et al. ................. 356/401 |
| 6,311,319 B1 | 10/2001 | Tu et al. ....................... 716/19 |
| 6,566,019 B2 * | 5/2003 | Kling et al. ................... 430/5 |

OTHER PUBLICATIONS

Handbook of Microlithography, Micromachining, and Microfabrication; vol. 1: Microlithography, Editor P. Rai–Choudhury; (1997), p. 79.

* cited by examiner

Primary Examiner—S. Rosasco
(74) Attorney, Agent, or Firm—Michael Shenker; MacPherson Kwok Chen & Heid LLP

(57) ABSTRACT

A photoresist layer is exposed two or more times. One exposure is conducted through a regular mask, and one exposure through a modified mask with a non-clear region extending beyond a convex boundary of the non-clear region of the regular mask. The exposure through the modified mask allows one to reduce the exposure dose used with the regular mask, and thus alleviates the resist overexposure near convex areas of the non-clear pattern of the regular mask. Other embodiments are also provided.

21 Claims, 6 Drawing Sheets

MULTIPLE PHOTOLITHOGRAPHIC EXPOSURES WITH DIFFERENT NON-CLEAR PATTERNS

BACKGROUND OF THE INVENTION

The present invention relates to photolithography.

Photolithography is widely used to form patterns on semiconductor wafers during fabrication of integrated circuits. A wafer 110 (FIG. 1) is coated with a photoresist layer 120. Resist 120 is irradiated from a light source 130. A mask or reticle 140 is placed between source 130 and resist 120. Mask 140 carries a pattern consisting of opaque and clear features. This pattern defines which areas of resist 120 are exposed to the light from source 130. After the exposure, the resist 120 is developed so that some of the resist is removed to uncover the underlying substrate 110. If the resist is "positive", then the resist is removed where it was exposed to the light. If the resist is "negative", the resist is removed where it was not exposed. In either case, the remaining resist and the exposed (uncovered) areas of substrate 110 reproduce the pattern on mask 140. The wafer is then processed as desired (e.g. the exposed areas of substrate 110 can be etched, implanted with dopant, etc.).

The resist pattern on wafer 110 is not always a faithful reproduction of the mask. In FIG. 2, an opaque feature 210M on mask 140 is a narrow line having two ends 220M. Line 210M should ideally be printed (reproduced) in resist 120 as line 210R, with ends 220R. In fact, the resist underlying the line 210M near the ends 210R gets overexposed. As a result, the line 210R is shortened and the line ends are smoothened in the resist pattern, as shown at 240.

The resist pattern can be corrected with hammerheads 310 (FIG. 3). The hammerheads are opaque regions appended at line ends 210M to reduce the resist exposure near the line ends. However, if the line ends 220M are close to other opaque features, the hammerheads can be difficult to form on the mask.

SUMMARY

The invention is defined by the appended claims which are incorporated into this section in their entirety. The rest of this section summarizes some features of the invention.

Some embodiments of the present invention provide alternative techniques to reduce overexposure of the resist. In some embodiments, the resist is exposed twice. One exposure is through a mask like in the prior art, for example, in FIG. 2 or 3, but the light dose is smaller. The other exposure is conducted through a different ("modified") mask which covers some or all of the resist at the line ends. The total energy delivered to the resist at the line ends is smaller as a result.

Other features and embodiments are described below.

DESCRIPTION OF SOME EMBODIMENTS

Figure 1:
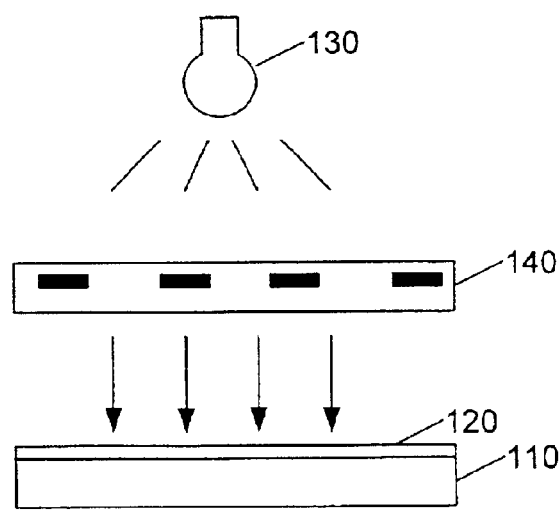
FIG. 1 is a side view illustrating a prior art photoresist exposure system suitable for some embodiments of the present invention.
Figure 2:
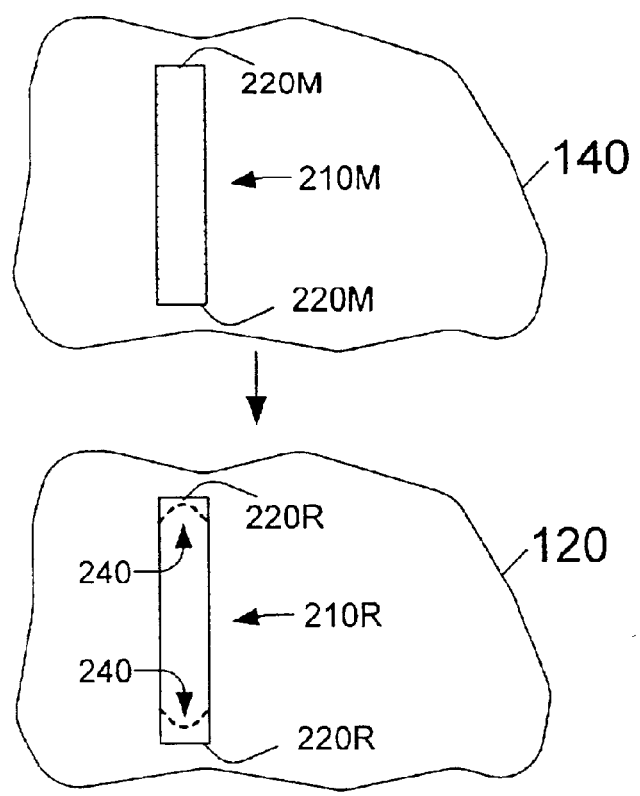
FIG. 2 is plan view of a prior art mask and a corresponding pattern formed in photoresist.
Figure 3:
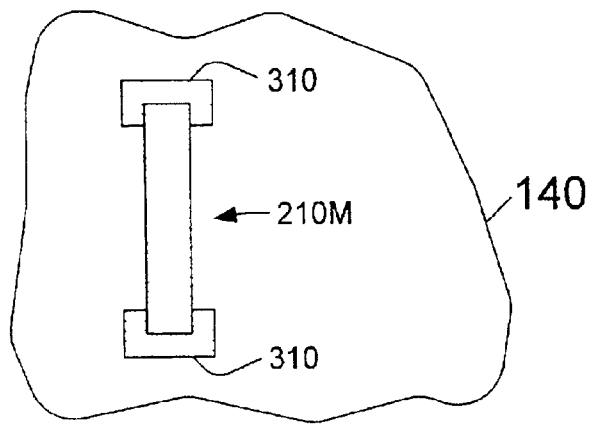
FIG. 3 is a plan view of a prior art mask.
Figure 4:
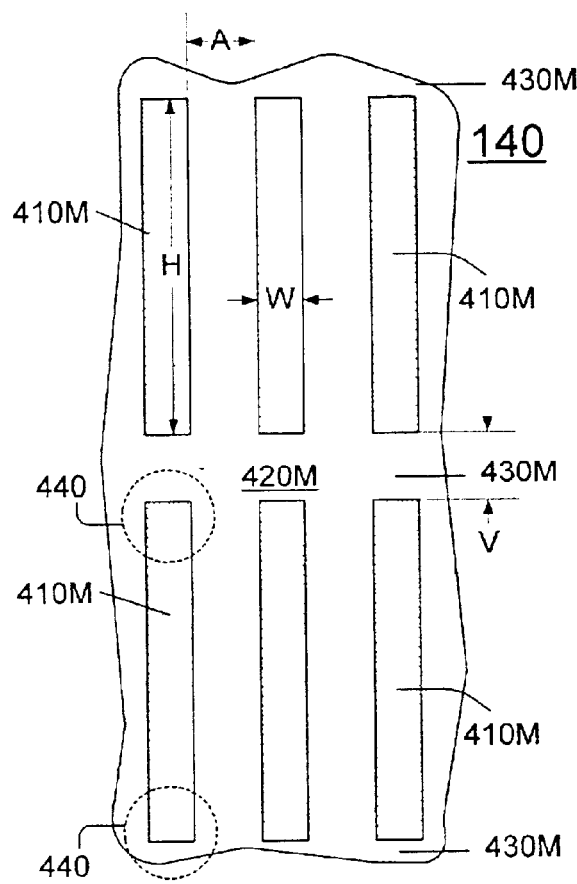
FIG. 4 is a plan view of a mask used in some embodiments of the present invention.

FIG. 4 illustrates an exemplary mask or reticle 140 which will now be used to illustrate some aspects of the invention. (The terms "mask" and "reticle" are used interchangeably herein.) The mask has a number of opaque regions 410M surrounded by a clear region 420M. Exemplary dimensions are as follows. Each opaque region 410M is a rectangle of a height H=1.38 μm and a width W=0.16 μm. The vertical gaps 430M between the adjacent rectangles 410M have each a height of V=0.16 μm. Each horizontal gap A is 0.28 μm. Light source 130 (FIG. 1) is a deep ultraviolet light source (DUV) having a wave length of 248 nm. (The dimensions and other details are given for illustration and are not limiting. Also, in one embodiment, the dimensions are 4 times larger than given above because the mask is used with a projection lens reducing the image on the wafer by a factor of 4.)

Each rectangle 410M has two convex ends 440.

Figure 5:
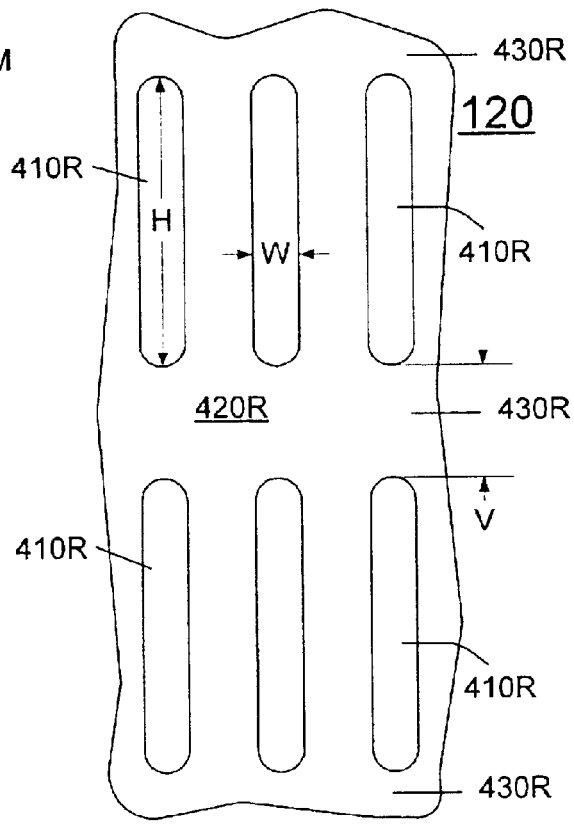
FIG. 5 is a plan view of a resist pattern corresponding to the mask of FIG. 4.

The resist pattern formed on the wafer is shown in FIG. 5. Regions 410R, 420R, 430R correspond to respective mask regions 410M, 420M, 430M. The rectangles 410R are rounded, and their height H is reduced. The width W may also be reduced.

Figure 6:
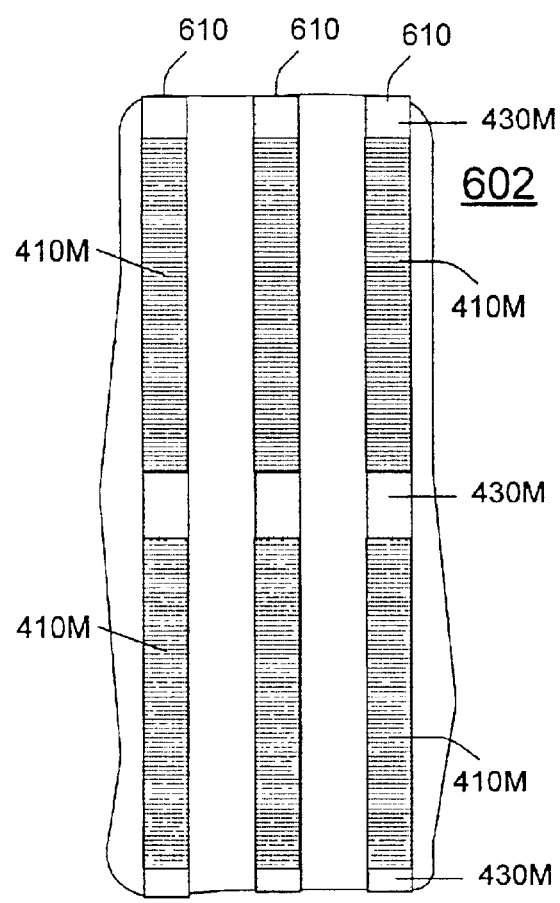
FIGS. 6–11 are plan views of masks used in some embodiments of the present invention.

A more faithful image can be obtained by exposing the resist twice. One exposure is conducted with the mask 140 but with a reduced radiation dose. The other exposure is performed with a modified mask 602 (FIG. 6). In mask 602, each opaque region 610 extends vertically ("in the y direction") through an area corresponding to an entire column of rectangles 410M (FIG. 4). The positions of the rectangles 410M are shown with denser stippling. Each region 610 covers the areas corresponding to the rectangles 410M and the vertical gaps 430M in one column.

In an exemplary embodiment, the exposures are conducted with a scanner of type ASML 500 available from ASML of Tempe, Ariz., which uses a 248 nm light source. The exposures are conducted with a positive resist. The "best dose" BD recommended by ASML is 27.5 mJ/cm². (The best dose corresponds to an exposure through mask 140 only). The minimal dose needed to form a pattern (to dissolve the exposed resist during the resist developing process) is believed to be about 22 mJ/cm². The exposure through mask 140 can be conducted with a reduced dose D1 of 22 mJ/cm² or greater. Doses from 22 mJ/cm² to 27 mJ/cm² are believed to be suitable. The exposure through mask 602 is conducted with a dose D2=BD−D1. The process is summarized in the following table.

TABLE 1

1. Expose the resist through mask 602 with the dose D2 = BD − D1 (0.5 to 5.5 mJ/cm²).
2. Then (after the wafer has been baked and cooled down) perform an exposure through mask 140 with the dose D1 (22 to 27 mJ/cm²).
3. Develop the resist.

The dose values are exemplary. Steps 1 and 2 can be interchanged. The total dose can be greater or less than the best dose. In Table 1, the dose D2 is at less than ¼ of the dose D1. Other relationships between D1 and D2 are possible.

In Table 1, the dose D1 is at least as large as the minimal dose needed to create a resist pattern (22 mJ/cm²). The is done to insure that the gaps 430R are opened in the resist pattern (i.e., they receive sufficient exposure for the positive resist to be dissolved or the negative resist not to be dissolved in the developing process).

Creating the modified mask 602 of FIG. 6 can be easier than forming hammerheads. For example, if the gaps A and V in FIG. 4 are the minimum feature size, the hammerheads may require sub-lithographic dimensions (i.e., smaller than the minimum feature size) but mask 602 can be formed without sub-lithographic features. However, some embodiments of the present invention combine the mask layout of FIG. 4 with hammerheads. Also, the invention is not limited to the embodiments in which no sub-lithographic features are needed in mask 602.

In FIG. 6, each region 610 is as wide as a rectangle 410M. In some embodiments, the regions 610 are wider than the rectangles to accommodate a possible misalignment between the masks 602 and 140. In either case, regions 610 cover the positions of rectangles 410M except for a possible mask misalignment. The maximum mask misalignment in the system ASML500 is 20 nm.

Figure 7:
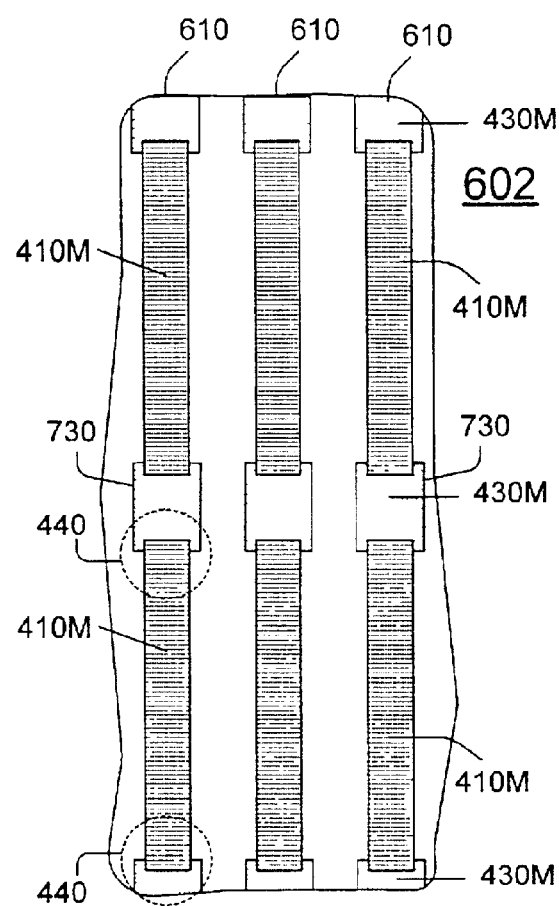

FIGS. 7–10 show alternative designs for mask 602. In FIG. 7, the mask is identical to that of FIG. 6 except that each opaque region 610 has a horizontal extension 730 at each gap 430M. Each extension 730 extends in the x and y directions (i.e. horizontally and vertically) beyond the respective gap 430M. Each extension 730 overlaps the adjacent rectangles 410M located above and below the gap. In other embodiments, extensions 730 do not extend vertically over the rectangles. In either case, extensions 730 reduce the exposure of the resist at the rectangle ends 440. Each extension 730 is like two merged hammerheads formed at the ends of rectangles 410M over a gap 430M. Writing one extension 730 on a mask is easier (faster and less defect prone) than writing two small hammerheads spaced from each other.

Figure 8:
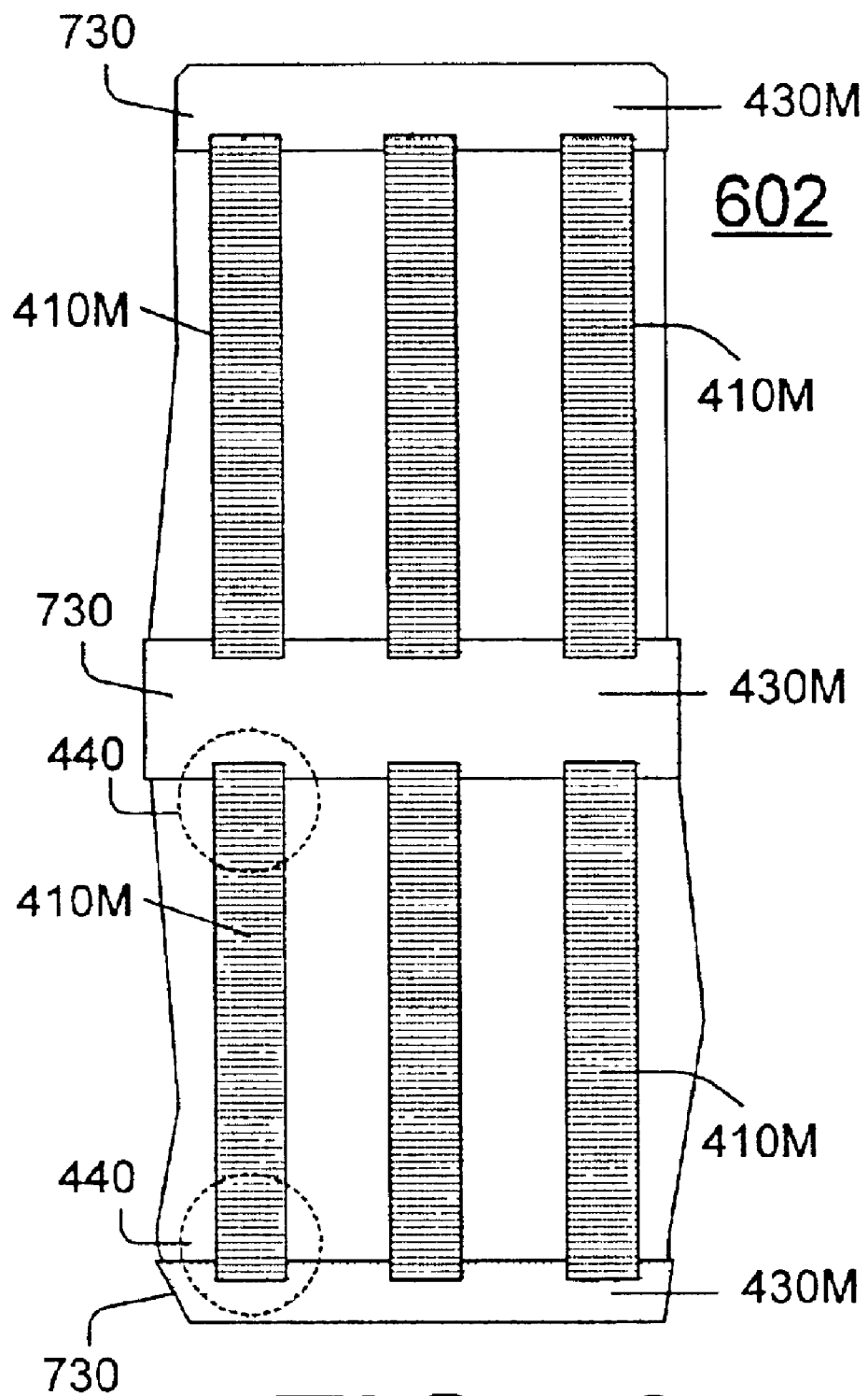

FIG. 8 shows an identical mask except that the extensions 730 are merged into horizontal strips. Each strip 730 traverses the entire array of rectangles 410M. The strips 730 are greater in height than gaps 430M, so the strips 730 overlap the positions of rectangles 410M. In other embodiments, the strips 730 do not overlap the rectangles.

The mask of FIG. 8 may be easier to write than the masks of FIGS. 6 and 7. Also, the mask of FIG. 8 advantageously provides less exposure at rectangle ends 440.

Figure 9:
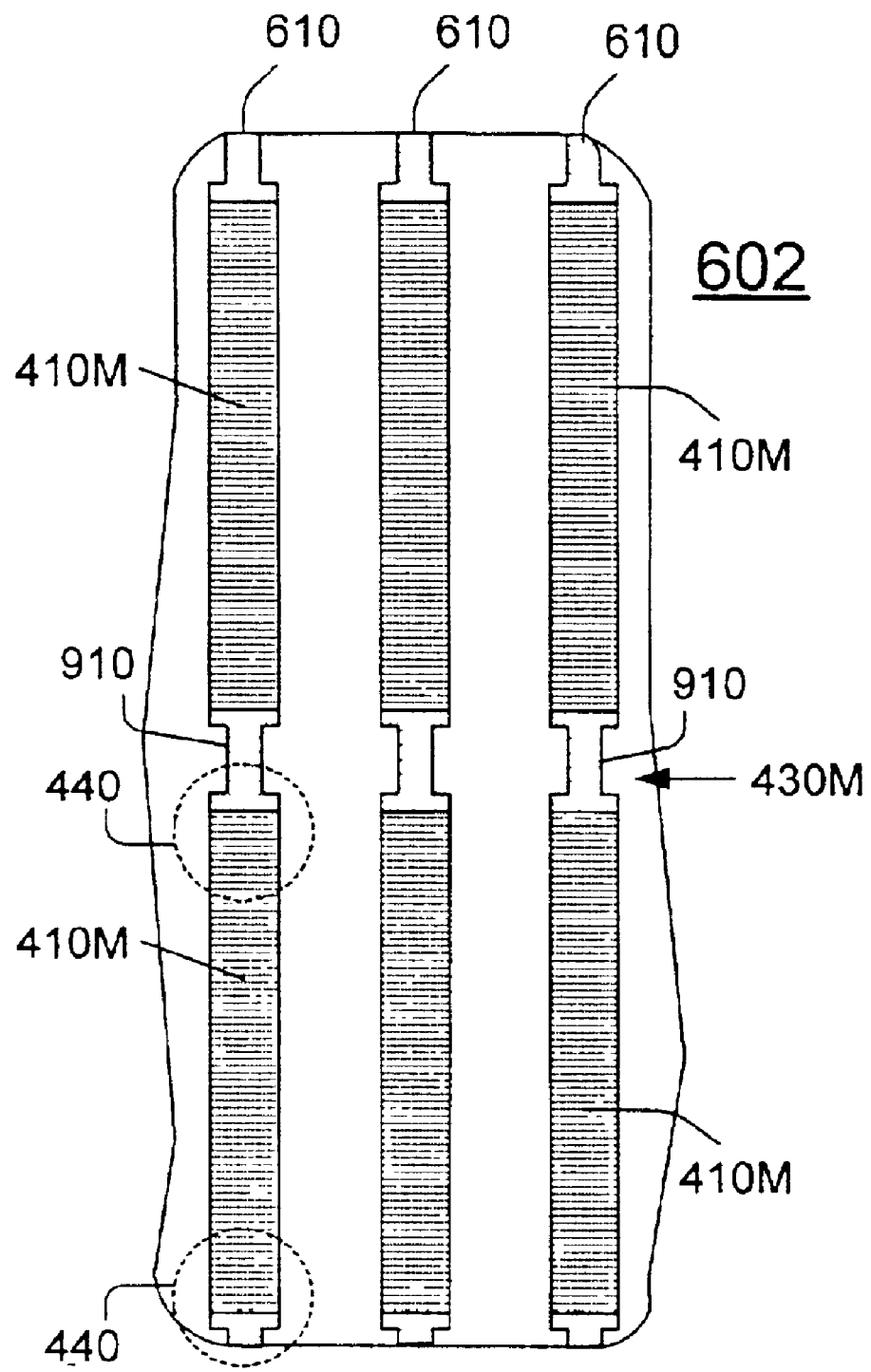

FIG. 9 is similar to FIG. 6, but strips 610 are made narrower in gaps 430M than rectangles 410M. The wide portions of strips 610 cover the rectangles 410M and extend into the gaps. With this mask, more diffracted light gets into gaps 430M, so the dose D1 can be lower.

Figure 10:
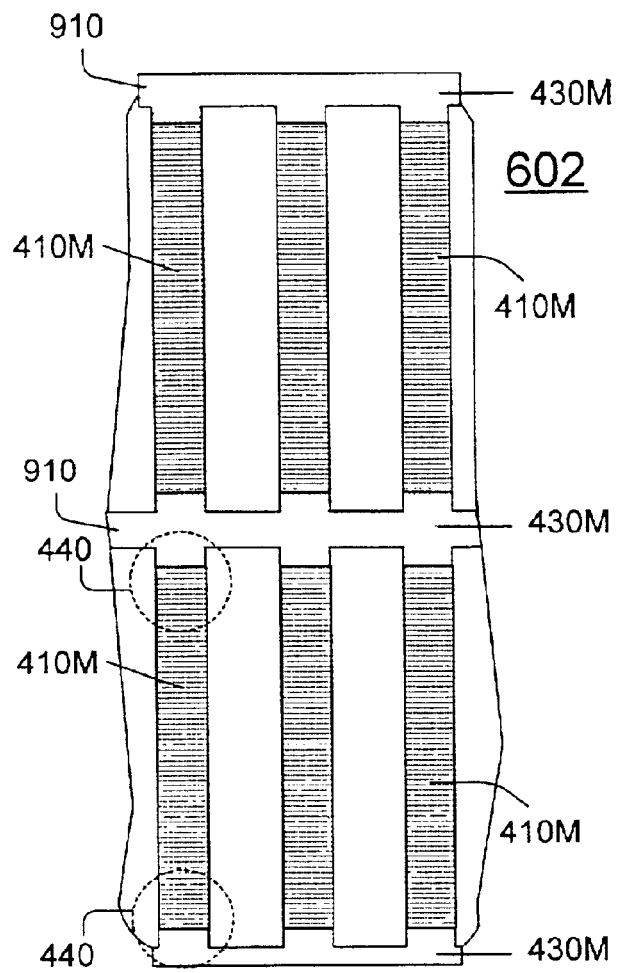

FIG. 10 is similar to FIG. 8, but horizontal strips 730 are narrower in the y direction than the gaps so that the strips 730 do not reach the rectangles 410M. This mask can be easier to write than the mask of FIG. 9.

Figure 11:
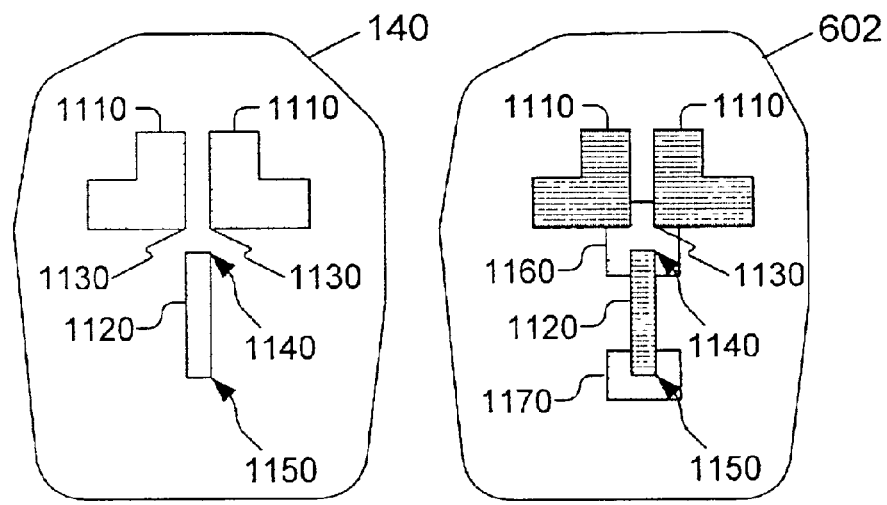

The invention is not limited to rectangular features 410M. In FIG. 11, mask 140 has two non-rectangular opaque features 1110 and a rectangular opaque feature 1120. Features 1110 each have a convex corner 1130. Rectangle 1120 has ends 1140, 1150. Mask 602 includes the features 1110, 1120 in the same position as mask 140. Mask 602 also includes an opaque extension 1160 which merges with the features 1110, 1120 and covers the two angles 1130 and the end 1140. Mask 602 also has a hammerhead 1170 at end 1150. Mask 602 may include other serifs, hammerheads, and other optical proximity correction features, known or to be invented.

The above techniques can be combined with other photolithographic techniques. For example, some or all of the opaque regions can be replaced with partially transmitting non-clear regions. See the aforementioned "Handbook of Microlithography, Micromachining, and Microfabrication", volume 1, page 79, incorporated herein by reference. Masks 140, 602 can be binary masks, phase shift masks, or other types of masks, known or to be invented. The invention is not limited to any particular mask patterns or dimensions, resist types, exposure doses, wavelengths, or other parameters, or any particular materials or equipment. More than two masks can be used to expose a resist layer. For example, the resist can be exposed with mask 140 of FIG. 4 and with masks 602 of both of FIGS. 6 and 7. Additional masks can be used as commonly done in the phase shift mask technology (a phase shift mask is conventionally combined with a binary mask). The invention is defined by the appended claims.

What is claimed is:

1. A method for processing a layer of material sensitive to radiation, the layer being formed on a substrate, the method comprising:

irradiating the material with said radiation; and developing the material to remove a portion of the material and expose a portion of the substrate, creating a pattern defined by the exposed portion of the substrate;

wherein the irradiating operation comprises:

(a) irradiating said material through a first mask which has a clear region and a non-clear region; and (b) irradiating said material through a second mask which has a clear region and a non-clear region;

wherein the non-clear region of the first mask covers a position of the non-clear region of the second mask, and the non-clear region of the first mask extends beyond a boundary of the position of the non-clear region of the second mask.

2. The method of claim 1 wherein a radiation dose in the operation (b) is sufficient by itself to enable the developing operation to create a pattern with a portion of the substrate exposed and a portion of the substrate not exposed.

3. The method of claim 1 wherein a radiation dose in the operation (a) is at most ¼ of the radiation dose in the operation (b).

4. The method of claim 3 wherein a radiation dose in the operation (a) is at most ⅑ of the radiation dose in the operation (b).

5. The method of claim 1 wherein the non-clear region of the second mask has a convex portion, and the non-clear region of the first mask extends beyond a position of the boundary of the convex portion.

6. The method of claim 5 wherein the convex portion is an end of an elongated feature.

7. The method of claim 5 wherein the convex portion comprises a corner, and the non-clear region of the first mask covers and surrounds the position of a vertex of the corner.

8. The method of claim 1 wherein the non-clear region of the second mask comprises two sub-regions separated by a gap; and the non-clear region of the first mask extends between the positions of the sub-regions across the position of the gap.

9. A mask set for processing a layer of material sensitive to radiation, the layer being formed on a substrate, the mask set comprising:

a first mask which has a clear region and a non-clear region; and a second mask which has a clear region and a non-clear region;

wherein the non-clear region of the first mask covers a position of the non-clear region of the second mask, and the non-clear region of the first mask extends beyond a boundary of the position of the non-clear region of the second mask.

10. The mask set of claim 9 wherein the non-clear region of the second mask has a convex portion, and the non-clear region of the first mask extends beyond a position of the boundary of the convex portion.

11. The mask set of claim 10 wherein the convex portion is an end of an elongated feature.

12. The mask set of claim 10 wherein the convex portion comprises a corner, and the non-clear region of the first mask covers and surrounds the position of a vertex of the corner.

13. The mask set of claim 9 wherein the non-clear region of the second mask comprises two sub-regions separated by a gap; and the non-clear region of the first mask extends between the positions of the sub-regions across the position of the gap.

14. A method for processing a layer of material sensitive to radiation, the layer being formed on a substrate, the method comprising:

irradiating the material with said radiation; and developing the material to remove a portion of the material and expose a portion of the substrate, creating a pattern defined by the exposed portion of the substrate;

wherein the irradiating operation comprises:

(a) irradiating said material through a first mask which has a clear region and a non-clear region; and (b) irradiating said material through a second mask which has a clear region and a non-clear region;

wherein a surface of said material comprises a first region which is an entire region exposed to said radiation in the operation (a), and the surface of said material has a second region exposed to said radiation in the operation (b);

wherein the second region contains the first region and is larger than the first region.

15. The method of claim 14 wherein a radiation dose in the operation (b) is sufficient by itself to enable the developing operation to create a pattern with a portion of the substrate exposed and a portion of the substrate not exposed.

16. The method of claim 14 wherein a radiation dose in the operation (a) is at most ¼ of the radiation dose in the operation (b).

17. The method of claim 16 wherein a radiation dose in the operation (a) is at most ⅛ of the radiation dose in the operation (b).

18. The method of claim 14 wherein the surface of said material has a third region which is an entire region not exposed to said radiation in the operation (a), and the surface of said material has a fourth region which is an entire region not exposed to said radiation in the operation (b); and the fourth region has a convex portion, and the third region extends beyond a position of the boundary of the convex portion.

19. The method of claim 18 wherein the convex portion is an end of an elongated feature.

20. The method of claim 18 wherein the convex portion comprises a corner, and the third region covers and surrounds the position of a vertex of the corner.

21. The method of claim 14 wherein the surface of said material has a third region which is an entire region not exposed to said radiation in the operation (a), and the surface of said material has a fourth region which is an entire region not exposed to said radiation in the operation (b);

the fourth region comprises two sub-regions separated by a gap; and the third region extends between the positions of the sub-regions across the position of the gap.

* * * * *